United States Patent
Khlat et al.

(10) Patent No.: US 9,853,685 B2
(45) Date of Patent: Dec. 26, 2017

(54) TUNABLE DUPLEXER ARRANGEMENT CONFIGURED FOR TDD OPERATION

(71) Applicant: RF Micro Devices, Inc., Greensboro, NC (US)

(72) Inventors: Nadim Khlat, Cugnaux (FR); Jayanti Jaganatha Rao, Jamestown, NC (US)

(73) Assignee: Qorvo US, Inc., Greensboro, NC (US)

( * ) Notice: Subject to any disclaimer, the term of this patent is extended or adjusted under 35 U.S.C. 154(b) by 530 days.

(21) Appl. No.: 14/329,493

(22) Filed: Jul. 11, 2014

(65) Prior Publication Data

US 2015/0016313 A1    Jan. 15, 2015

Related U.S. Application Data

(60) Provisional application No. 61/844,940, filed on Jul. 11, 2013.

(51) Int. Cl.

| | |
|---|---|
| *H03H 7/46* | (2006.01) |
| *H03H 7/01* | (2006.01) |
| *H04B 1/525* | (2015.01) |
| *H04L 5/14* | (2006.01) |
| *H04L 5/16* | (2006.01) |

(52) U.S. Cl.
CPC .......... *H04B 1/525* (2013.01); *H03H 7/0153* (2013.01); *H03H 7/463* (2013.01); *H04L 5/14* (2013.01); *H04L 5/1415* (2013.01); *H04L 5/1469* (2013.01); *H04L 5/16* (2013.01)

(58) Field of Classification Search
CPC ....... H04L 5/14; H04L 5/1415; H04L 5/1469; H04L 5/16; H04L 5/18; H03H 7/463; H03H 7/0153; H04B 1/525

USPC ................................ 333/132, 174, 175, 17.1
See application file for complete search history.

(56) References Cited

U.S. PATENT DOCUMENTS

| | | | |
|---|---|---|---|
| 5,937,348 A * | 8/1999 | Cina | H04M 1/725 |
| | | | 379/100.15 |
| 2003/0102941 A1 * | 6/2003 | Amano | H01P 1/2013 |
| | | | 333/202 |
| 2004/0127178 A1 * | 7/2004 | Kuffner | H01P 1/15 |
| | | | 455/133 |

* cited by examiner

*Primary Examiner* — Rakesh Patel
(74) *Attorney, Agent, or Firm* — Withrow & Terranova, P.L.L.C.

(57) ABSTRACT

RF duplexing and methods of operating the same are described herein. In one embodiment, an RF duplexing system may include a control circuit and a duplexer with a first tunable RF filter and second tunable RF filter. The control circuit is operable in a full duplexing transmission mode and a half duplexing transmission mode. The control circuit tunes the first tunable RF filter in the full duplexing transmission mode so that the first tunable RF filter defines a transmission passband and tune the second tunable RF filter so that the second tunable RF filter defines a receive passband. Also, the control circuit tunes one of the tunable RF filters so that the tunable RF filter defines the passband while the other tunable RF filter enhances the passband. In this manner, the tunable RF filters in the duplexer are both utilized to get better performance during the half duplexing mode.

30 Claims, 5 Drawing Sheets

TUNABLE DUPLEXER ARRANGEMENT CONFIGURED FOR TDD OPERATION

RELATED APPLICATION

This application claims the benefit of provisional patent application Ser. No. 61/844,940, filed Jul. 11, 2013, the disclosure of which is hereby incorporated herein by reference in its entirety.

FIELD OF THE DISCLOSURE

This disclosure relates generally to systems and methods that provide duplexing in radio frequency (RF) communication bands.

BACKGROUND

A radio frequency (RF) duplexing device is a device that facilitates full duplexing (i.e., simultaneous reception and transmission) by a common antenna. In order to facilitate simultaneous reception and transmission by the antenna, the RF duplexing device operates at both an RF receive band of an RF receive signal and an RF transmission band of an RF transmission signal. However, in order to reduce the number of components utilized in RF front-end systems, it is desirable that components be reused to provide additional functionality. As such, RF duplexing devices are also used to provide half duplexing (i.e., only providing reception or only providing transmission). Generally, previously known RF duplexing devices "waste" components in the RF duplexing device that do not provide filtering during half duplexing. For example, if only reception is being provided during the half duplexing mode, components that provide filtering for transmission are "wasted" and may actually degrade performance by introducing insertions losses. Similarly, if only transmission is being provided during the half duplexing mode, components that provide filtering for reception are "wasted" and may also degrade performance by introducing insertion losses. Accordingly, systems and methods that utilize components in an RF duplexing device operate more efficiently when the RF duplexing device is providing half duplexing.

SUMMARY

This disclosure describes radio frequency (RF) duplexing systems that are tunable and methods of operating the same. In one embodiment, an RF duplexing system may include a first duplexer and a control circuit. The first duplexer includes a first tunable RF filter and a second tunable RF filter that are tuned by the control circuit. The control circuit is operable in a full duplexing mode and a half duplexing mode. With regard to the full duplexing mode, the control circuit is configured to tune the first tunable RF filter in the full duplexing mode so that the first tunable RF filter defines a transmission passband and tunes the second tunable RF filter so that the second tunable RF filter defines a receive passband. With regard to the half duplexing mode, the control circuit may be configured to tune one of the tunable RF filters so that the tunable RF filter defines the passband (i.e., either the transmission passband or the receive passband) while the other tunable RF filter enhances the passband. In this manner, the tunable RF filters in the first duplexer are both utilized to get better performance during the half duplexing mode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

This disclosure relates to radio frequency (RF) duplexing systems that include one or more RF duplexing devices operated to provide full duplexing and half duplexing. RF front-end modules may include one or more of the RF duplexing devices to allow for reception of RF receive signals and emission of RF transmission signals using a common antenna. With respect to reception, an RF duplexing device may receive an RF receive signal from the common antenna and then output the RF receive signal to downstream RF circuitry within the RF front-end module for processing. On the other hand, with respect to transmission, the RF duplexing device may receive an RF transmission signal from upstream RF circuitry in the RF front-end module and output the RF transmission signal for emission by the common antenna. For example, an RF duplexing device may be coupled within the RF front-end module between a common antenna and one or more RF receive chains. One or more tunable RF filters may be provided in the RF duplexing device so that the RF receive signal is routed from the common antenna to an RF receive chain. In addition, the RF duplexing device may simultaneously be coupled within the RF front-end module between one or more RF transmission chains and the common antenna. One or more tunable RF filters may be provided in the RF duplexing device to route the RF transmission signal from an RF transmission chain to the common antenna. The RF duplexing device provides full duplexing when the RF duplexing device facilitates bi-directional communication (i.e., simultaneous reception and emission) by the common antenna. In contrast, the RF duplexing device provides half duplexing when the RF duplexing device facilitates single-directional communication (i.e., only reception or only emission) by the common antenna. However, rather than "wasting" the tunable RF filters that are not directly involved in routing while half duplexing, the RF duplexing device is operated so that these tunable RF filters assist the tunable RF filter that is directly involved in routing while half duplexing. As such, the tunable RF filters of the RF duplexing device are used more efficiently while the RF duplexing device provides single-directional communications.

To tune the RF duplexing device during full duplexing and half duplexing, the RF duplexing systems may also include a control circuit that is operable in at least one full duplexing mode and at least one half duplexing mode. The control circuit may be a specialized control circuit designed simply to operate a single RF duplexing device. In another embodiment, the control circuit may be a specialized control circuit designed to control multiple RF duplexing devices. Alternatively, the control circuit may not be specially designed for operating one or more RF duplexing devices but rather may be a more generalized control circuit that provides other types of control functionality within the RF front-end module. Additionally, the control circuit may be provided by amalgamations of specialized and general control components within the RF duplexing system and the RF front-end module. While in a full duplexing mode, the control circuit is configured to tune tunable RF filters in the RF duplexing device so that the RF duplexing device facilitates bi-directional communication using the common antenna. On the other hand, while in a half duplexing mode, the control circuit is configured to tune one or more RF filters in the RF duplexing device to provide routing for single-directional communications. With regard to the one or more other tunable RF filters not being used to provide routing during single-directional communication, the control circuit is configured to tune these other RF filters to augment the operation of the tunable RF filters that are being used for routing. In this manner, the RF duplexing device disclosed herein obtains better performance than traditional RF duplexing devices while half duplexing.

Figure 1:
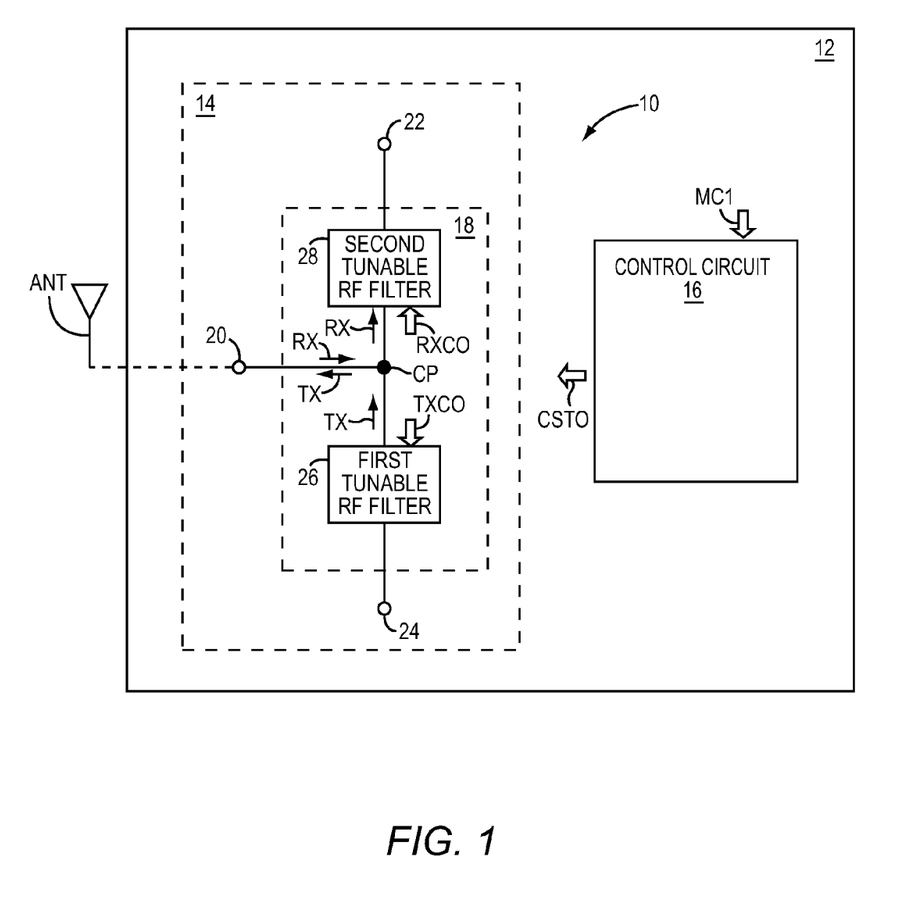
FIG. 1 illustrates one embodiment of a radio frequency (RF) duplexing system that includes a first duplexer and a control circuit operable in a full duplexing mode, a half duplexing transmission mode, and a half duplexing receive mode.

FIG. 1 illustrates one embodiment of an RF duplexing system 10 formed on a semiconductor substrate 12. As shown in FIG. 1, the RF duplexing system 10 includes an RF duplexing device 14 and a control circuit 16. The RF duplexing device 14 illustrated in FIG. 1 includes a first duplexer 18, an antenna port 20, a receive port 22, and a transmission port 24. The antenna port 20, the receive port 22, and/or the transmission port 24 (and any other port described in this disclosure) may be formed by any type of waveguide component for inputting and/or outputting RF signals to or from the RF duplexing device 14. In this embodiment, the antenna port 20, the receive port 22, and the transmission port 24 in FIG. 1 are formed on the semiconductor substrate 12. As such, the antenna port 20, the receive port 22, and the transmission port 24 are each provided as a terminal formed on the semiconductor substrate 12. However, in other embodiments, the antenna port 20, the receive port 22, and/or the transmission port 24 may be not be provided by the semiconductor substrate 12. For example, the antenna port 20, the receive port 22, and/or the transmission port 24 (and any other port described in this disclosure) may be provided as terminals exposed externally from an integrated circuit (IC) package (not shown) that houses the semiconductor substrate 12. In fact, the antenna port 20, the receive port 22, and/or the transmission port 24 (and any other port described herein) may not be discrete, but rather may simply be nodes for inputting and/or outputting RF signals to or from the RF duplexing device 14.

The antenna port 20 shown in FIG. 1 is operable to simultaneously input an RF receive signal RX that operates within an RF receive band, and output an RF transmission signal TX that operates within an RF transmission band. In this manner, an antenna ANT may be coupled to the antenna port 20, thereby allowing for simultaneous reception of the RF receive signal RX and emission of the RF transmission signal TX by the antenna ANT when the RF duplexing device 14 is being used to provide full duplexing. However, when the RF duplexing device 14 is providing transmission in a half duplexing mode, the antenna port 20 outputs the RF transmission signal TX toward the antenna ANT but does not input the RF receive signal RX from the antenna ANT. Additionally, when the RF duplexing device 14 is providing receive half duplexing, the antenna port 20 inputs the RF receive signal RX from the antenna ANT but does not output the RF transmission signal TX towards the antenna ANT.

The control circuit 16 is operable in a full duplexing mode, a half duplexing transmission mode, and a half duplexing receive mode. In the full duplexing mode, the control circuit 16 is configured to tune the RF duplexing device 14 so that the RF duplexing device 14 allows for simultaneous reception of the RF receive signal RX and emission of the RF transmission signal TX by the antenna ANT. When the control circuit 16 is in the half duplexing transmission mode, the control circuit 16 is configured to tune the RF duplexing device 14 to allow for emission of the RF transmission signal TX by the antenna ANT and to block the RF receive signal RX from the antenna ANT. Finally, when the control circuit 16 is in the half duplexing receive mode, the control circuit 16 is configured to tune the RF duplexing device 14 to block emission of the RF transmission signal TX by the antenna ANT and to allow for reception of the RF receive signal RX from the antenna ANT.

During both full duplex mode and half duplexing receive mode, reception of the RF receive signal RX may be provided by the antenna ANT. The antenna port 20 may be coupled to receive the RF receive signal RX from the antenna ANT. For example, the antenna port 20 may receive the RF receive signal RX directly from the antenna ANT or through other circuitry connected between the RF duplexing device 14 and the antenna ANT. For example, an antenna tuner (not shown) may be coupled between the antenna ANT and the antenna port 20. Once the RF duplexing device 14 receives the RF receive signal RX at the antenna port 20, the RF duplexing device 14 transmits the RF receive signal RX from the antenna port 20 to the receive port 22. The receive port 22 is operable to output the RF receive signal RX. In this manner, the RF receive signal RX may be provided to external downstream RF circuitry (i.e., a receiver chain—not shown) on the semiconductor substrate 12, on a different semiconductor substrate within the IC package, or on a semiconductor substrate external to the IC package. However, the RF duplexing device 14 does not output the RF transmission signal TX at the antenna port 20 in the half duplexing receive mode but does output the RF transmission signal TX at the antenna port 20 in the full duplexing mode as described below.

During both full duplexing mode and half duplexing transmission mode, the transmission port 24 is operable to input the RF transmission signal TX. The RF transmission signal TX may be generated by upstream RF circuitry (i.e., a transmission chain—not shown) on the semiconductor substrate 12 on a different semiconductor substrate within the IC package, or on a semiconductor substrate external to the IC package. The transmission port 24 may be coupled to receive the RF transmission signal TX from the upstream RF circuitry. Once the RF duplexing device 14 receives the RF transmission signal TX at the transmission port 24, the RF duplexing device 14 is configured to transmit the RF transmission signal TX from the transmission port 24 to the antenna port 20. In this manner, the RF transmission signal TX may be emitted by the antenna ANT. However, the RF duplexing device 14 does not input the RF receive signal RX at the antenna port 20 in the half duplexing transmission mode but does input the RF receive signal RX at the antenna port 20 in the full duplexing mode as described above. Consequently, in the full duplexing mode, the RF duplexing device 14 is tuned by the control circuit 16 such that the RF duplexing device 14 simultaneously inputs the RF receive signal RX and outputs the RF transmission signal TX at the antenna port 20.

In this embodiment, the control circuit 16 is configured to generate a tuning control output CSTO in order to tune the RF duplexing device 14. The tuning control output CSTO may include one or more control signals, such as analog control signals and/or digital control signals. The RF duplexing device 14 is operable to receive the tuning control output CSTO and is responsive to the tuning control output CSTO so as to adjust tunable components in accordance with the tuning control output CSTO. It should be noted that the tuning control output CSTO may itself be divided into different tuning control outputs to control different tunable components in the RF duplexing device. The control circuit 16 is also configured to receive a mode control input MCI. The mode control input MCI may include one or more control signals, such as analog control signals and/or digital control signals. The mode control input MCI may include information indicative of the operational mode in which the control circuit should operate. For example, the mode control input MCI may be indicative of the full duplexing mode, the half duplexing transmission mode, or the half duplexing receive mode. Thus, the control circuit 16 may be responsive so as to operate in the operating mode indicated by the mode control input MCI.

On the other hand, the mode control input MCI may be indicative of more general modes. For example, the control circuit 16 may be operable in a time duplexing mode. In this case, the control circuit 16 may operate in the half duplexing transmission mode during one or more transmission time periods and operate in the half duplexing receive mode during one or more receive time periods. Additionally, the control circuit 16 may be operable in multiple frequency duplexing modes and the mode control input MCI may indicate any one of the frequency duplexing modes. In this case, the control circuit 16 operates in the full duplexing mode but is tuned to different RF receive and transmission bands depending on the particular frequency duplexing mode indicated by the mode control input MCI.

In this embodiment, the control circuit 16 is formed by the same semiconductor substrate 12 as the RF duplexing device 14. However, in other embodiments, the control circuit 16 may be provided in a separate semiconductor substrate. The separate semiconductor substrate may be in the same IC package as the semiconductor substrate 12 or in a different IC package.

Also, the control circuit 16 may be provided as any type of electronic arrangement capable of tuning tunable components within the RF duplexing device 14. The control circuit 16 may be an analog circuit, a digital circuit, or an amalgamation between an analog circuit and a digital circuit. With regard to the digital circuit, the digital circuit may include general purpose computer hardware, such as processor(s), and computer readable memory that stores computer executable instructions for execution by the general purpose computer hardware. However, as is apparent to one of ordinary skill in the art, any system that uses general purpose computer hardware and computer executable instructions, can also be implemented with a hardwired hardware digital circuit that utilizes hardwired digital hardware specifically configured to provide the same functionality as the general purpose computer and computer executable instructions. Accordingly, this disclosure does not intend to limit the control circuit 16 described to any specific type of implementation. Instead, the control circuit 16 may be implemented using analog circuits, software modules, hardwired hardware circuits, or some combination of any of these types of circuits. All of these implementations are considered to be within the scope of this disclosure.

As shown in FIG. 1, the RF duplexing device 14 includes the first duplexer 18. The first duplexer 18 illustrated in FIG. 1 has a first tunable RF filter 26 and a second tunable RF filter 28. In this embodiment, the first tunable RF filter 26 receives a tuning control output TXCO, which is part of the tuning control output CSTO from the control circuit 16. In this manner, the control circuit 16 is configured to tune the first tunable RF filter 26. Similarly, the second tunable RF filter 28 receives a tuning control output RXCO, which is also part of the tuning control output CSTO from the control circuit 16. In this manner, the control circuit 16 is configured to tune the second tunable RF filter 28.

In the first duplexer 18, the first tunable RF filter 26 is coupled between the antenna port 20 and the transmission port 24. The second tunable RF filter 28 is coupled between the antenna port 20 and the receive port 22. More specifically, the first tunable RF filter 26 and the second tunable RF filter 28 are both coupled to a common port CP within the first duplexer 18. The common port CP is coupled to the antenna port 20. As shown in FIG. 1, the first tunable RF filter 26 is coupled between the common port CP and the transmission port 24. Thus, the first tunable RF filter 26 is configured to provide a transmission passband from the transmission port 24 to the antenna port 20. The second tunable RF filter 28 is coupled between the common port CP and the receive port 22. Thus, the second tunable RF filter 28 is configured to provide a receive passband from the antenna port 20 to the receive port 22.

The control circuit 16 is configured to tune the first tunable RF filter 26 in the full duplexing mode so that the first tunable RF filter 26 defines the transmission passband. The transmission passband is placed within the RF transmission band of the RF transmission signal TX. As such, the first tunable RF filter 26 is tuned to pass the RF transmission signal TX from the transmission port 24 to the antenna port 20. The control circuit 16 is also configured to tune the second tunable RF filter 28 in the full duplexing mode so that the second tunable RF filter 28 defines the receive passband. The receive passband is placed within the RF receive band of the RF receive signal RX. As such, the second tunable RF filter 28 is tuned to pass the RF receive signal RX from the antenna port 20 to the receive port 22. Consequently, in the full duplexing mode, the control circuit 16 tunes the first duplexer 18 to simultaneously pass the RF transmission signal TX from the transmission port 24 to the antenna port 20 and pass the RF receive signal RX from the antenna port 20 to the receive port 22.

The control circuit 16 is also operable in the half duplexing transmission mode. The control circuit 16 is configured to tune the first tunable RF filter 26 in the half duplexing transmission mode so that the first tunable RF filter 26 defines the transmission passband. The transmission passband is placed within the RF transmission band of the RF transmission signal TX. As such, the first tunable RF filter 26 is tuned to pass the RF transmission signal TX from the transmission port 24 to the antenna port 20. However, the control circuit 16 is configured to tune the second tunable RF filter 28 in the half duplexing transmission mode so that the second tunable RF filter 28 enhances the transmission passband.

In this case, the control circuit 16 may tune the second tunable RF filter 28 in the half duplexing transmission mode so as to not provide the receive passband and block the RF receive band. Instead, the second tunable RF filter 28 is tuned by the control circuit 16 so that characteristics of the transmission passband are improved. For example, if the second tunable RF filter 28 includes resonators, such as LC resonators, the control circuit 16 may tune the resonators so that poles and zeros create a notch at a frequency corner of the transmission passband. This helps increase roll-off of the transmission passband and allows for greater out-of-band rejection. Additionally or alternatively, the control circuit 16 may tune the resonators of the second tunable RF filter 28 so that poles and zeros provide a magnitude increase to the transmission passband in comparison to the transmission passband in the full duplexing mode. As such, attenuation of the transmission passband may be decreased while selectivity of the transmission passband is increased in comparison to the transmission passband in the full duplexing mode. Consequently, in the half duplexing transmission mode, the control circuit 16 tunes the first duplexer 18 to pass only the RF transmission signal TX from the transmission port 24 to the antenna port 20 but not pass the RF receive signal RX from the antenna port 20 to the receive port 22. Instead, the control circuit 16 tunes the second tunable RF filter 28 to improve the transmission passband and thereby improve the performance of the first duplexer 18 during the half duplexing transmission mode.

The control circuit 16 is also operable in the half duplexing receive mode. The control circuit 16 is configured to tune the second tunable RF filter 28 in the half duplexing receive mode so that the second tunable RF filter 28 defines the receive passband. The receive passband is placed within the RF receive band of the RF receive signal RX. As such, the second tunable RF filter 28 is tuned to pass the RF receive signal RX from the antenna port 20 to the receive port 22. However, the control circuit 16 is configured to tune the first tunable RF filter 26 in the half duplexing receive mode so that the first tunable RF filter 26 enhances the receive passband.

In this case, the control circuit 16 may tune the first tunable RF filter 26 in the half duplexing receive mode so as to not provide the transmission passband and block the RF transmission band. Instead, the first tunable RF filter 26 is tuned by the control circuit 16 so that characteristics of the receive passband are improved. For example, if the first tunable RF filter 26 includes resonators, such as LC resonators, the control circuit 16 may tune the resonators so that poles and zeros create a notch at a frequency corner of the receive passband. This helps increase roll-off of the receive passband and allows for greater out-of-band rejection. Additionally or alternatively, the control circuit 16 may tune the resonators of the first tunable RF filter 26 so that poles and zeros provide a magnitude increase to the receive passband in comparison to the receive passband in the full duplexing mode. As such, attenuation of the receive passband may be decreased while selectivity of the receive passband is increased in comparison to the receive passband in the full duplexing mode. Consequently, in the half duplexing receive mode, the control circuit 16 tunes the first duplexer 18 to pass only the RF receive signal RX from the antenna port 20 to the receive port 22 but not pass the RF transmission signal TX from the transmission port 24 to the antenna port 20. Instead, the control circuit 16 tunes the first tunable RF filter 26 to improve the receive passband and thereby improve the performance of the first duplexer 18 during the half duplexing receive mode. As such, the tunable RF filters 26, 28 of the first duplexer 18 are used more efficiently while the first duplexer 18 is tuned by the control circuit 16 to provide single-directional communications.

Figure 2:
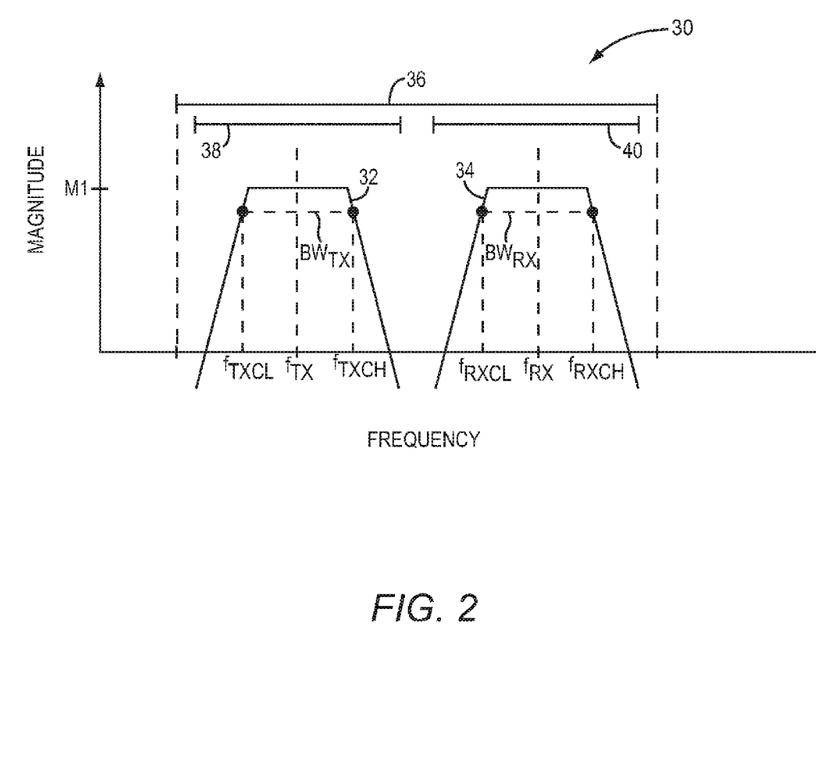
FIG. 2 illustrates an embodiment of a transfer function of the first duplexer shown in FIG. 1 when the control circuit is in the full duplexing mode.

Referring now to FIGS. 1 and 2, FIG. 2 illustrates one embodiment of a transfer response 30 of the RF duplexing device 14 when the control circuit 16 is in the full duplexing mode. As shown in FIG. 2, the transfer response 30 includes a transmission passband 32 that is provided by the first tunable RF filter 26 from the transmission port 24 to the antenna port 20. The transfer response 30 also includes a receive passband 34 provided by the second tunable RF filter 28 from the antenna port 20 to the receive port 22. The transmission passband 32 and the receive passband 34 have to be placed within an RF communication band 36. More specifically, the transmission passband 32 has been placed within an RF transmission band 38 defined by the RF communication band 36. The receive passband 34 has been placed within an RF receive band 40 defined by the RF communication band 36. The control circuit 16 tunes the first duplexer 18 to provide both the transmission passband 32 and the receive passband 34 in the full duplexing mode so that the first duplexer 18 is tuned to simultaneously pass the RF transmission signal TX from the transmission port 24 to the antenna port 20 and pass the RF receive signal RX from the antenna port 20 to the receive port 22.

The transmission passband 32 extends in the frequency domain from a low corner frequency $f_{TXCL}$ to a high corner frequency $f_{TXCH}$, which are both within the RF transmission band 38. The transmission passband 32 is centered at a transmission frequency $f_{TX}$, which is a transmission frequency of the RF transmission signal TX. A peak magnitude of the transmission passband 32 is provided around a magnitude M1. In this embodiment, a bandwidth $BW_{TX}$ of the transmission passband 32 is equal to $f_{TSCH} - f_{TXCL}$. The low corner frequency $f_{TXCL}$ is provided at $f_{TX} - (BW_{TX}/2)$ and the high corner frequency is provided at $f_{TX} + (BW_{TX}/2)$.

With respect to the receive passband 34. The receive passband 34 extends in the frequency domain from a low corner frequency $f_{RXCL}$ to a high corner frequency $f_{RXCH}$, which are both within the RF receive band 40. The receive passband 34 is centered at a receive frequency $f_{RX}$, which is a receive frequency of the RF receive signal RX. A peak magnitude of the transmission passband 32 is also provided around a magnitude M1. In this embodiment, a bandwidth $BW_{RX}$ of the receive passband is equal to $f_{RXCH} - f_{RXCL}$. The low corner frequency $f_{RXCL}$ is provided at $f_{RX} - (BW_{RX}/2)$ and the high corner frequency $f_{RXCH}$ is provided at $f_{RX} + (BW_{RX}/2)$. The full duplexing mode may be provided during a frequency division duplexing mode associated with the RF communication band 36 where the RF transmission signal TX and the RF receive signal RX are provided to and from the antenna ANT simultaneously.

Figure 3:
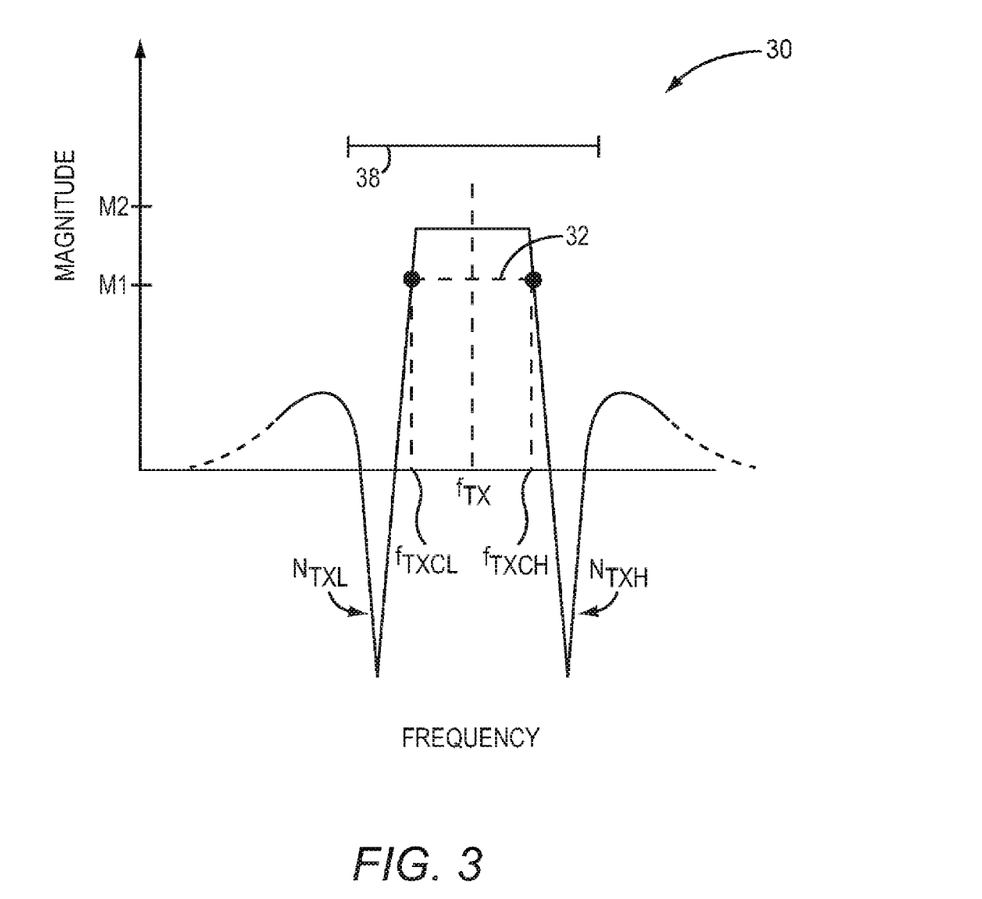
FIG. 3 illustrates an embodiment of a transfer function of the first duplexer shown in FIG. 1 when the control circuit is in the half duplexing transmission mode.

Referring now to FIGS. 1 and 3, FIG. 3 illustrates one embodiment of the transfer response 30 of the RF duplexing device 14 when the control circuit 16 is in the half duplexing transmission mode. As shown in FIG. 3, the receive passband 34 is not provided. Rather, only the transmission passband 32 is provided by the first tunable RF filter 26 within the RF transmission band 38. Instead, the control circuit 16 is configured to tune the second tunable RF filter 28 in the half duplexing transmission mode so that the second tunable RF filter 28 enhances the transmission passband. One way that the control circuit 16 tunes the second tunable RF filter 28 to enhance the transmission passband 32 is by tuning the second tunable RF filter 28 in the half duplexing transmission mode so that the second tunable RF filter 28 provides a magnitude increase to the transmission passband 32. As shown in FIG. 3, the peak magnitude of the transmission passband 32 is provided at magnitude M2, which is greater than the magnitude M1. Accordingly, attenuation of the transmission passband 32 has been decreased while selectivity has been increased. The control circuit 16 is also configured to tune the second tunable RF filter 28 in the half duplexing transmission mode so that the second tunable RF filter 28 enhances the transmission passband by being configured to provide a notch $N_{TXH}$ adjacent to the high frequency corner $f_{TXCH}$ of the transmission passband 32 and a notch $N_{TXL}$ adjacent to the low frequency corner $f_{TXCL}$ of the transmission passband 32. Since the notches $N_{TXH}$, $N_{TXL}$ can provide a sharp increase in attenuation, the second tunable RF filter 28 also enhances the transmission passband 32 by being configured to increase roll-off of the transmission passband 32. The half duplexing transmission mode may be during a transmission period of a time division duplexing mode associated with the RF communication band 36 (shown in FIG. 2) where the RF transmission signal TX is being provided to the antenna ANT while the RF receive signal RX is not provided from the antenna ANT.

Figure 4:
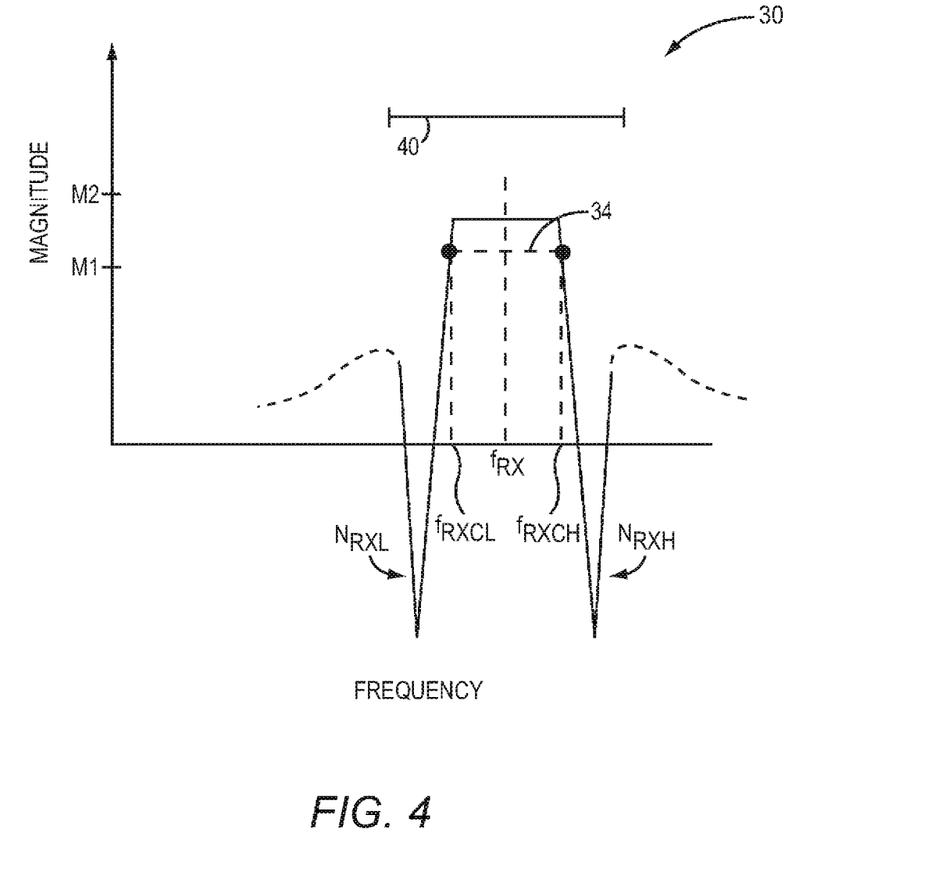
FIG. 4 illustrates an embodiment of a transfer function of the first duplexer shown in FIG. 1 when the control circuit is in the half duplexing transmission mode.

Referring now to FIGS. 1 and 4, FIG. 4 illustrates one embodiment of the transfer response 30 of the RF duplexing device 14 when the control circuit 16 is in the half duplexing transmission mode. As shown in FIG. 4, the transmission passband 32 is not provided. Rather, only the receive passband 34 is provided by the second tunable RF filter 28 within the RF receive band 40. Instead, the control circuit 16 is configured to tune the first tunable RF filter 26 in the half duplexing receive mode so that the first tunable RF filter 26 enhances the receive passband 34. One way that the control circuit 16 tunes the first tunable RF filter 26 to enhance the receive passband 34 is by tuning the first tunable RF filter 26 in the half duplexing receive mode so that the first tunable RF filter 26 provides a magnitude increase to the receive passband 34. As shown in FIG. 4, the peak magnitude of the receive passband 34 is provided at magnitude M2, which is greater than the magnitude M1. Accordingly, attenuation of the receive passband 34 has been decreased while selectivity has been increased. The control circuit 16 is also configured to tune the first tunable RF filter 26 in the half duplexing receive mode so that the first tunable RF filter 26 enhances the receive passband 34 by being configured to provide a notch $N_{RXH}$ adjacent to the high frequency corner $f_{RXCH}$ of the receive passband 34 and a notch $N_{RXL}$ adjacent to the low frequency corner $f_{RXCL}$ of the receive passband 34. Since the notches $N_{RXH}$, $N_{RXL}$ can provide a sharp increase in attenuation, the first tunable RF filter 26 enhances the receive passband 34 by being configured to increase roll-off of the receive passband 34. The half duplexing receive mode may be during a receive period of the time division duplexing mode associated with the RF communication band 36 (shown in FIG. 2) where the RF transmission signal TX is not being provided to the antenna ANT while the RF receive signal RX is being provided to the antenna ANT.

Figure 5:
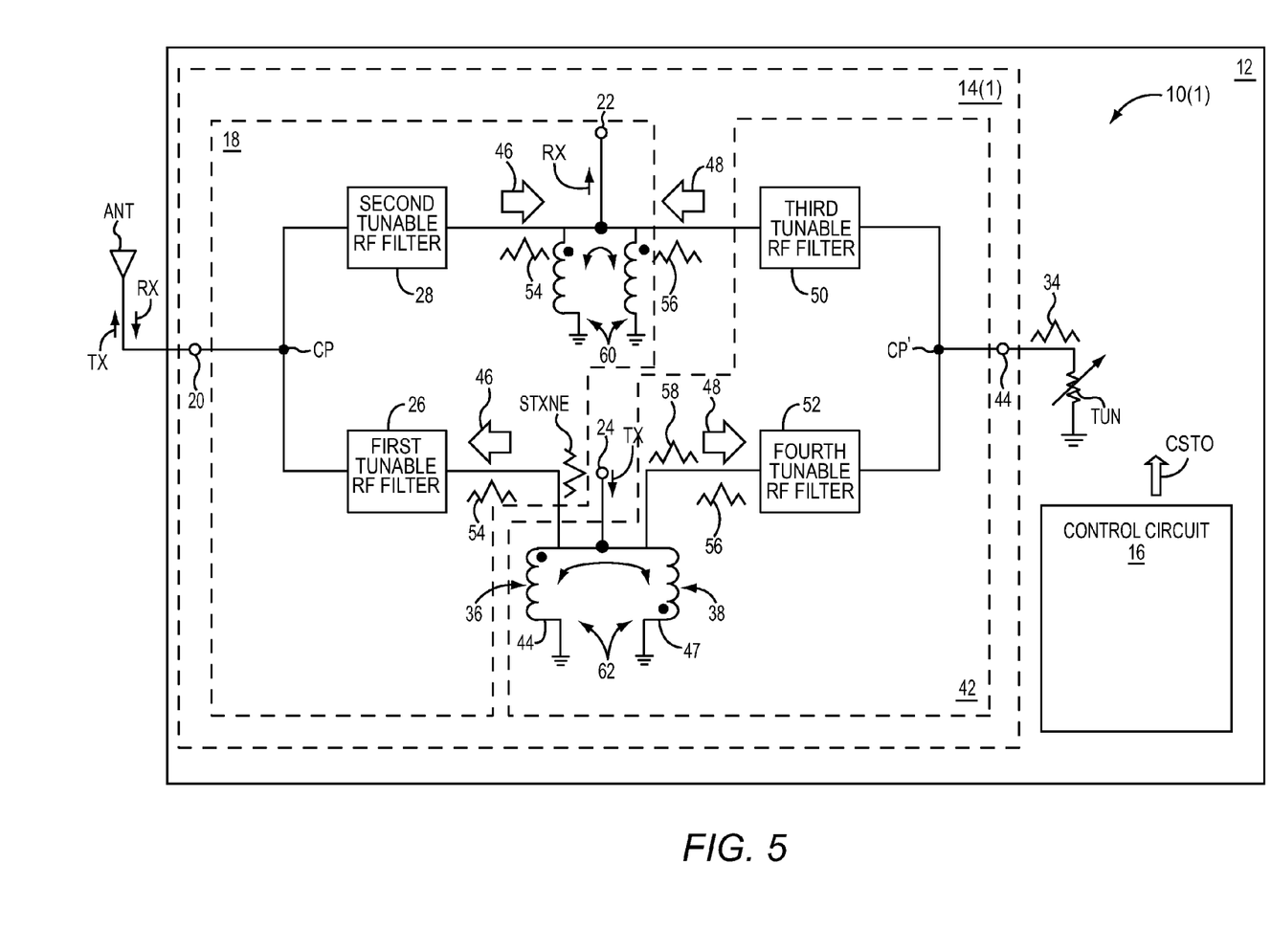
FIG. 5 illustrates another embodiment of an RF duplexing system that includes a first duplexer, a second duplexer, and a control circuit operable in a full duplexing mode, a half duplexing transmission mode, and a half duplexing receive mode wherein the first duplexer is configured to provide a first phase shift from a transmission port to a receive port, and a second duplexer is configured to provide a second phase shift that is differential to the first phase shift of the first duplexer from the transmission port to the receive port.

FIG. 5 illustrates another embodiment of an RF duplexing system 10(1) formed on the semiconductor substrate 12. The RF duplexing system includes an RF duplexing device 14(1) and the control circuit 16, which was described above. Like the RF duplexing device 14 shown in FIG. 1, the RF duplexing device 14(1) includes the first duplexer 18, the antenna port 20, the receive port 22, and the transmission port 24. However, in this embodiment, the RF duplexing device 14(1) further includes a second duplexer 42 and a tuning port 44.

The RF duplexing device 14(1) provides a high level of isolation from the transmission port 24 to the receive port 22 without introducing significant insertion losses. To do this, the RF duplexing device 14(1) does not rely solely on impedances to provide isolation, but rather provides increased isolation through cancellation. As shown in FIG. 5, the first duplexer 18 is coupled to the transmission port 24 and the receive port 22. In this embodiment, the first duplexer 18 is configured to provide a first phase shift from the transmission port 24 to the receive port 22. Thus, in a signal direction 46 from the transmission port 24, the first phase shift is provided from the transmission port 24 to the receive port 22. For example, assume that an RF signal having a phase with a phase value represented by $\Phi$ radians is input into the first duplexer 18 from the transmission port 24. Also, assume that the first phase shift is represented by $\Delta$ in radians. When the RF signal is transmitted through the first duplexer 18 from the transmission port 24 to the receive port 22, the phase of the RF signal is shifted by the first phase shift $\Delta$. Thus, the RF signal is output to the first duplexer 18 with the phase being shifted to a phase value $\Phi + \Delta$ radians.

The second duplexer 42 is also coupled to the transmission port 24 and the receive port 22. The second duplexer 42 is configured to provide a second phase shift that is differential to the first phase shift from the transmission port 24 to the receive port 22. Accordingly, in a signal direction 48 that is the opposite of the signal direction 46, the second duplexer 42 provides the second phase shift. Since the second phase shift provided by the second duplexer 42 is differential to the first phase shift provided by the first duplexer 18, signals traveling from the transmission port 24 in the signal direction 46 and out of the first duplexer 18 toward the receive port 22 are substantially cancelled by signals traveling from the transmission port 24 in the signal direction 48 and out of the second duplexer 42 toward the receive port 22. For example, assuming again that the first phase shift of the first duplexer 18 is represented by $\Delta$ radians, the second phase shift would then be equal to about $\Delta + \pi$ radians. Alternatively, the second phase shift could equal about $\Delta - \pi$ radians. If the RF signal having the phase with a phase value represented by $\Phi$ radians is transmitted through the second duplexer 42 from the transmission port 24 to the receive port 22, the RF signal is output from the second duplexer 42 with the phase being shifted approximately a phase value $\Phi+\Delta+\pi$.

It should be noted that the first phase shift provided by the first duplexer 18 may have any value from 0 to $2\pi$ radians (0° to 360°), and the second phase shift provided by the second duplexer 42 may have any value from 0 to $2\pi$ radians (0° to 360°), so long as a difference between the first phase shift and the second phase shift has an absolute value of approximately $|\pi|$ radians (|180°|), or is approximately an integer multiple of $|\pi|$ radians (|180°|). This difference of approximately $|\pi|$ radians or $n*|\pi|$ radians (where n is an integer) is what makes the second phase shift differential to the first phase shift. How close the difference between the first phase shift and the second phase shift has to be to $|\pi|$ radians (or $n*|\pi|$ radians) may depend on design specifications such as isolation tolerances for a particular RF application, spectral distribution techniques employed by a particular multiplexing scheme, and/or spectral requirements dictated by an RF communication standard. In the example provided above, the difference between the first phase shift and the second phase shift is $\Delta+\pi-\Delta$, which is equal to $\pi$ radians.

The RF duplexing device 14(1) shown in FIG. 1 can be manufactured to meet the requirements of a wide variety of multiplexing schemes and RF communication standards. For example, the RF receive signal RX and the RF transmission signal TX may be encoded using any conventional encoding techniques such as, code division multiple access multiplexing (CDMA), orthogonal frequency division multiple access multiplexing (OFDMA), and/or the like. Additionally, the RF duplexing device 14(1) may be configured to provide duplexing for various RF communication standards. For example, the RF receive signal RX and the RF transmission signal TX may be formatted in accordance with 2G Global System for Mobile Communications (GSM) standards, 3G standards, 4G Long Term Evolution (LTE) standards, and/or the like. Furthermore, the RF duplexing device 14(1) may provide duplexing for various specifications within these RF communication standards, along with their RF communication bands. For instance, the RF transmission signal TX and the RF receive signal RX may be formatted in accordance with and in RF communication bands defined by specifications of the 2G GSM standard, such as a Digital Communication System (DCS) specification, a Personal Communications Service (PCS) specification, a GSM-850 specification, and a GSM-900 specification; specifications within the 3G standard, such as an Enhanced Data Rates for GSM Evolution (EDGE)-850 specification, an EDGE-950 specification, an EDGE-1800 specification, and an EDGE-1900 specification; and specifications within the 4G LTE standard, such as a Mobile Device Management (MDM) specification, a High Speed Packet Access (HSPA) specification, a Multiple-Input and Multiple-Output (MIMO) specification, and/or the like.

Referring again to FIG. 5, the antenna port 20 of the RF duplexing device 14(1) is coupled to the first duplexer 18. In order to avoid, minimize, or reduce reflections of the RF transmission signal TX at the antenna port 20, an impedance, as seen by the RF duplexing device 14(1) into the antenna port 20, should match an impedance of the RF duplexing device 14(1) as seen externally from the antenna port 20. The tuning port 44 is coupled to the second duplexer 42. Furthermore, a tuner TUN is coupled to the tuning port 44. The control circuit 16 is configured to tune the tuner TUN in the full duplexing mode so as to provide impedance matching between the antenna port 20 and the receive port 22 and between the antenna port 20 and the transmission port 24. By coupling the tuning port 44 with the second duplexer 42, and coupling the antenna port 20 with the first duplexer 18, the RF duplexing device 14(1) is designed to eliminate, or at least reduce, insertion losses at the tuning port 44. The second duplexer 42 also includes a third tunable RF filter 50 and a fourth tunable RF filter 52. The third tunable RF filter 50 is coupled between a common port CP' and the receive port 22. The tuning port 44 is coupled to the common port CP'. Thus, the third tunable RF filter 50 is coupled between the tuning port 44 and the receive port 22. The fourth tunable RF filter 52 is coupled between the common port CP' and the transmission port 24. Thus, the fourth tunable RF filter 52 is coupled between the tuning port 44 and the transmission port 24. The third tunable RF filter 50 may receive a tuning output from the control circuit 16 so that the control circuit 16 can tune the third tunable RF filter 50. This tuning output may be part of the tuning output CSTO generated by the control circuit 16. Similarly, the fourth tunable RF filter 52 may receive a tuning output from the control circuit 16 so that the control circuit 16 can tune the fourth tunable RF filter 52. This tuning output may also be part of the tuning output CSTO generated by the control circuit 16.

The control circuit 16 is configured to tune the first duplexer 18 in the full duplexing mode, the half duplexing transmission mode, and the half duplexing receive mode in the same manner that the RF duplexing device 14 was tuned as described above with respect to FIGS. 1-4. In addition, while the control circuit 16 is in the full duplexing mode and in the half-duplexing transmission mode, the control circuit 16 is configured to tune the first tunable RF filter 26 so that the first tunable RF filter 26 defines a receive stopband within the RF receive band from the transmission port 24 to the antenna port 20. In this manner, the RF receive signal RX is blocked from propagating towards the transmission port 24 through the first duplexer 18. Also, while the control circuit 16 is in the full duplexing mode and in the half-duplexing receive mode, the control circuit 16 is configured to tune the first tunable RF filter 26 so that the second tunable RF filter 26 defines a transmission stopband within the RF transmission band from the receive port 22 to the antenna port 20. In this manner, the RF transmission signal TX is blocked from propagating towards the receive port 22 through the first duplexer 18.

With regard to the second duplexer 42, the control circuit 16 is configured to tune the third tunable RF filter 50 in the full duplexing mode to provide the receive stopband within the RF receive band from the tuning port 44 to the receive port 22 and to provide the transmission passband within the RF transmission band from the receive port 22 to the tuning port 24. The control circuit 16 is also configured to tune the fourth tunable RF filter 52 in the full duplexing mode to provide the transmission stopband within the RF transmission band from the transmission port 24 to the tuning port 44 and to provide the receive passband within the RF receive band from the tuning port 44 to the transmission port 24.

Accordingly, while the control circuit 16 is in the full duplexing mode, the RF duplexing device 14(1) may input the RF transmission signal TX and spurious transmission noise emissions STXNE outside the RF transmission band 38 of the RF transmission signal TX at the transmission port 24. As seen at the transmission port 24, the first duplexer 18 shown in FIG. 5 is configured to block the RF receive band of the RF receive signal RX but allow for RF bands outside of the RF receive band to pass, including the RF transmission band. On the other hand, as seen at the transmission port 24, the second duplexer 42 shown in FIG. 5 is configured to block the RF transmission band of the RF transmission signal TX but allow for bands outside of the RF transmission band to pass, including the RF receive band. As a result, the spurious transmission noise emissions STXNE are split into a first hybrid noise signal 54, a second hybrid noise signal 56, and a third hybrid noise signal 58. The first hybrid noise signal 54 is outside both the RF transmission band and the RF receive band, and is directed to be received by the first duplexer 18. The first hybrid noise signal 54 thus propagates in the signal direction 46. The second hybrid noise signal 56 is also outside of both the RF transmission band and the RF receive band, and is directed in the signal direction 48 to be received by the second duplexer 42. The second hybrid noise signal 56 thus propagates in the signal direction 48. The third hybrid noise signal 58 is within the RF receive band of the RF receive signal RX and is also directed in the signal direction 48 to be received by the second duplexer 42. The third hybrid noise signal 58 thus propagates in the signal direction 48.

The tuner TUN may be coupled to the tuning port 44 to filter the third hybrid noise signal 58. For example, the tuner TUN may have a frequency response that defines a passband and may be tunable to provide the passband within the RF receive band. As such, the third hybrid noise signal 58 within the RF receive band is transmitted out of the RF duplexing device 14(1) so as to not interfere with the RF receive signal RX. The first hybrid noise signal 54 is output from the first duplexer 18 (in the signal direction 46) toward the receive port 22, while the second hybrid noise signal 56 is output from the second duplexer 42 (in the signal direction 48) toward the receive port 22. However, as mentioned above, the first duplexer 18 provides the first phase shift from the transmission port 24 to the receive port 22, and the second duplexer 42 provides the second phase shift from the transmission port 24 to the receive port 22. Since the first phase shift and the second phase shift are differential, the phase of the first hybrid noise signal 54 has a phase difference of approximately π radians (180°) with respect to the phase of the second hybrid noise signal 56. As a result, the first hybrid noise signal 54 and the second hybrid noise signal 56 cancel at the receive port 22.

The first duplexer 18 is configured to transmit the RF transmission signal TX from the transmission port 24 to the antenna port 20. Note that the second duplexer 42 blocks the RF receive band, as seen from the transmission port 24. Thus, the RF transmission signal TX is transmitted entirely or almost entirely in the signal direction 46 and into the first duplexer 18. Therefore, none (or only a small amount) of the power in the RF transmission band is dissipated through the tuner coupled to the tuning port 44. Accordingly, the RF duplexing device 14(1) avoids a 3 dB insertion loss at the tuning port 44, while providing a significant amount of isolation from the transmission port 24 to the receive port 22.

With regard to the second duplexer 42 and the half duplexing transmission mode, the control circuit 16 is configured to turn off the third tunable RF filter 50 in the half duplexing transmission mode. Thus, the third tunable RF filter 50 appears approximately as an open circuit. However, the control circuit 16 is configured to tune the fourth tunable RF filter 52 in the half duplexing transmission mode such that the fourth tunable RF filter 52 provides the transmission stopband and the receive passband. Furthermore, in the half duplexing transmission mode, the fourth tunable RF filter 52 can be tuned by the control circuit 16 to provide additional filtering to out-of-band transmit signals at another frequency during a transmission time period of a time division duplex operation. Out-of-band transmit signals, such as first hybrid noise signal 54 can thus be dissipated into the receive port 22 while out-of-band transmit signals, such as second hybrid noise signal 56 located at the other frequency can be dissipated by the tuner TUN connected to the tuning port 44.

With regard to the second duplexer 42 and the half duplexing receive mode, the control circuit 16 is configured to turn off the fourth tunable RF filter 52 in the half duplexing receive mode. Thus, the fourth tunable RF filter 52 appears approximately as an open circuit. However, the control circuit 16 is configured to tune the third tunable RF filter 50 in the half duplexing transmission mode such that the third tunable RF filter 50 provides the receive stopband and the transmission passband. Furthermore, in the half duplexing receive mode, the third tunable RF filter 50 can be tuned by the control circuit 16 to another frequency to provide additional filtering during a receive time period of the time division duplex operation. Out-of-band receive signals, can thus be dissipated into the transmission port 24 while out-of-band receive signals can be dissipated by the tuner TUN connected to the tuning port 44.

In this embodiment, a first duplexer 18(1) includes a non-inverting transformer 60 coupled to the receive port 22 and between the second tunable RF filter 28 and the third tunable RF filter 50. A phase shift from the input to the output of the non-inverting transformer 60 may be represented as τ radians. The second duplexer 42 includes an inverting transformer 62 coupled to the transmission port 24 and between the first tunable RF filter 26 and the fourth tunable RF filter 52. The inverting transformer 62 is thus configured to provide a polarity inversion. Assuming that the inverting transformer 62 and the non-inverting transformer 60 have the same or similar electromagnetic characteristics, a phase shift from the input to the output of the inverting transformer 62 may equal τ+π radians.

In this embodiment, the first duplexer 18 provides a phase shift of β radians from an output of the non-inverting transformer 60 to the receive port 22. The second duplexer 42 provides the same phase shift of β radians from the output of the inverting transformer 62 to the receive port 22. Accordingly, the first phase shift (represented as Δ) of the first duplexer 18 in the signal direction 46 from the transmission port 24 to the receive port 22 is Δ=τ+β radians while the second phase shift (represented as Θ) of the second duplexer 42 in the signal direction 48 from the transmission port 24 to the receive port 22 is Θ=τ+π+β radians. As such, the second phase shift Θ is differential to the first phase shift Δ because a phase difference |Θ−Δ| between the first phase shift Δ and the second phase shift Θ is approximately equal to π radians. The polarity inversion of the inverting transformer 62 is thus provided such that the second phase shift Θ is differential to the first phase shift Δ.

In this embodiment, the third tunable RF filter 50 within the second duplexer 42 is identical to the first tunable RF filter 26 within the first duplexer 18. As a result, outside of both the RF transmission band and the RF receive band, the spurious transmission noise emissions STXNE at the transmission port 24 see approximately equal impedance from the transmission port 24 to the first duplexer 18 and from the transmission port 24 to the second duplexer 42. Additionally, the fourth tunable RF filter 52 is identical to the second tunable RF filter 28. The second duplexer 42 is identical to the first duplexer 18 but is coupled in an opposite manner with respect to the antenna port 20, the receive port 22, the transmission port 24, and the tuning port 44. Accordingly, the second duplexer 42 is transposed with respect to the first duplexer 18. Since the phase difference |Θ−Δ| between the first phase shift Δ and the second phase shift Θ is approximately equal to π radians, the first hybrid noise signal 54 and the second hybrid noise signal 56 cancel at the receive port 22. The situation is analogous with respect to receive noise. Receive noise is also split and canceled at the transmission port 24 as a result of the phase difference |Θ−Δ|.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) duplexing system comprising:
a first duplexer comprising a first tunable RF filter and a second tunable RF filter; and
a control circuit operable in a full duplexing transmission mode and in a half duplexing transmission mode, wherein the control circuit is configured to:
tune the first tunable RF filter in the full duplexing transmission mode so that the first tunable RF filter defines a transmission passband;
tune the second tunable RF filter in the full duplexing transmission mode so that the second tunable RF filter defines a receive passband;
tune the first tunable RF filter in the half duplexing transmission mode so that the first tunable RF filter defines the transmission passband; and
tune the second tunable RF filter in the half duplexing transmission mode so that the second tunable RF filter enhances the transmission passband.

2. The RF duplexing system of claim 1 wherein the control circuit is further operable in a half duplexing receive mode, wherein the control circuit is further configured to:
tune the second tunable RF filter in the half duplexing receive mode so that the second tunable RF filter defines the receive passband; and
tune the first tunable RF filter in the half duplexing receive mode so that the first tunable RF filter enhances the receive passband.

3. The RF duplexing system of claim 2 wherein the control circuit is further operable in a time division duplexing mode wherein, in the time division duplexing mode, the control circuit is configured to:
operate in the half duplexing transmission mode during a transmission time period; and
operate in the half duplexing receive mode during a receive time period.

4. The RF duplexing system of claim 1 wherein the control circuit is configured to tune the second tunable RF filter in the half duplexing transmission mode so that the second tunable RF filter enhances the transmission passband by being configured to provide a magnitude increase to the transmission passband.

5. The RF duplexing system of claim 1 wherein the control circuit is configured to tune the second tunable RF filter in the half duplexing transmission mode so that the second tunable RF filter enhances the transmission passband by being configured to decrease attenuation of the transmission passband.

6. The RF duplexing system of claim 1 wherein the control circuit is configured to tune the second tunable RF filter in the half duplexing transmission mode so that the second tunable RF filter enhances the transmission passband by being configured to provide a notch adjacent to a frequency corner of the transmission passband.

7. The RF duplexing system of claim 1 wherein the control circuit is configured to tune the second tunable RF filter in the half duplexing transmission mode so that the second tunable RF filter enhances the transmission passband by being configured to provide a first notch adjacent to a high frequency corner of the transmission passband and a second notch adjacent to a low frequency corner of the transmission passband.

8. The RF duplexing system of claim 1 wherein the control circuit is configured to tune the second tunable RF filter in the half duplexing transmission mode so that the second tunable RF filter enhances the transmission passband by being configured to increase roll-off of the transmission passband.

9. The RF duplexing system of claim 1 further comprising a transmission port, a receive port, and an antenna port, wherein:
the first tunable RF filter is coupled to the transmission port;
the second tunable RF filter is coupled to the receive port;
the first tunable RF filter is configured to provide the transmission passband from the antenna port to the transmission port; and
the second tunable RF filter is configured to provide the receive passband from the receive port to the antenna port.

10. The RF duplexing system of claim 1 further comprising an RF duplexing device, wherein the RF duplexing device comprises:
a transmission port;
a receive port;
an antenna port;
the first duplexer wherein the first duplexer is further configured to provide a first phase shift from the transmission port to the receive port; and
a second duplexer operably associated with the transmission port and the receive port, wherein the second duplexer is configured to provide a second phase shift that is differential to the first phase shift from the transmission port to the receive port.

11. The RF duplexing system of claim 10 wherein the second duplexer comprises a third tunable RF filter and a fourth tunable RF filter and wherein:
the first tunable RF filter is coupled to the transmission port;
the second tunable RF filter is coupled to the receive port;
the third tunable RF filter is coupled to the receive port; and
the fourth tunable RF filter is coupled to the transmission port.

12. The RF duplexing system of claim 11 wherein the control circuit is further configured to:
tune the third tunable RF filter in the full duplexing transmission mode so that the third tunable RF filter defines a receive stopband;
tune the fourth tunable RF filter in the full duplexing transmission mode so that the fourth tunable RF filter defines a transmission stopband;
tune the third tunable RF filter in the half duplexing transmission mode so that the third tunable RF filter is switched off; and
tune the fourth tunable RF filter in the half duplexing transmission mode so that the fourth tunable RF filter provides the transmission stopband.

13. The RF duplexing system of claim 12 wherein the RF duplexing device further comprises a tuning port and wherein:

the first tunable RF filter is configured to provide the transmission passband from the antenna port to the transmission port;
the second tunable RF filter is configured to provide the receive passband from the receive port to the antenna port;
the third tunable RF filter is configured to provide the receive stopband from the receive port to the tuning port; and
the fourth tunable RF filter is configured to provide the transmission stopband from the transmission port to the tuning port.

14. The RF duplexing system of claim 13 further comprising a tuner coupled to the tuning port, wherein the control circuit is configured to tune the tuner in the full duplexing transmission mode so as to provide impedance matching between the antenna port and the receive port and between the antenna port and the transmission port.

15. The RF duplexing system of claim 10 wherein the second duplexer is transposed with respect to the first duplexer.

16. The RF duplexing system of claim 10 wherein:
the first duplexer includes a non-inverting transformer; and
the second duplexer includes an inverting transformer, wherein the inverting transformer is configured to provide a polarity inversion such that the second phase shift is differential to the first phase shift.

17. A radio frequency (RF) duplexing system comprising:
a first duplexer comprising a first tunable RF filter and a second tunable RF filter; and
a control circuit operable in a full duplexing transmission mode and in a half duplexing receive mode, wherein the control circuit is configured to:
tune the first tunable RF filter in the full duplexing transmission mode so that the first tunable RF filter defines a transmission passband;
tune the second tunable RF filter in the full duplexing transmission mode so that the second tunable RF filter defines a receive passband;
tune the second tunable RF filter in the half duplexing receive mode so that the second tunable RF filter defines the receive passband; and
tune the first tunable RF filter in the half duplexing receive mode so that the first tunable RF filter enhances the receive passband.

18. The RF duplexing system of claim 17 wherein the control circuit is configured to tune the first tunable RF filter in the half duplexing receive mode so that the first tunable RF filter enhances the receive passband by being configured to provide a magnitude increase to the receive passband.

19. The RF duplexing system of claim 17 wherein the control circuit is configured to tune the first tunable RF filter in the half duplexing receive mode so that the first tunable RF filter enhances the receive passband by being configured to decrease attenuation of the receive passband.

20. The RF duplexing system of claim 17 wherein the control circuit is configured to tune the first tunable RF filter in the half duplexing receive mode so that the first tunable RF filter enhances the receive passband by being configured to provide a notch adjacent to a frequency corner of the receive passband.

21. The RF duplexing system of claim 17 wherein the control circuit is configured to tune the first tunable RF filter in the half duplexing receive mode so that the first tunable RF filter enhances the receive passband by being configured to provide a first notch adjacent to a high frequency corner of the receive passband and a second notch adjacent to a low frequency corner of the receive passband.

22. The RF duplexing system of claim 17 wherein the control circuit is configured to tune the first tunable RF filter in the half duplexing receive mode so that the first tunable RF filter enhances the receive passband by being configured to increase roll-off of the receive passband.

23. The RF duplexing system of claim 17 further comprising a transmission port, a receive port, and an antenna port wherein:
the first tunable RF filter is coupled to the transmission port;
the second tunable RF filter is coupled to the receive port;
the first tunable RF filter is configured to provide the transmission passband from the antenna port to the transmission port; and
the second tunable RF filter is configured to provide the receive passband from the receive port to the antenna port.

24. The RF duplexing system of claim 17 further comprising an RF duplexing device, wherein the RF duplexing device comprises:
a transmission port;
a receive port;
an antenna port;
the first duplexer wherein the first duplexer is further configured to provide a first phase shift from the transmission port to the receive port; and
a second duplexer operably associated with the transmission port and the receive port, wherein the second duplexer is configured to provide a second phase shift that is differential to the first phase shift from the transmission port to the receive port.

25. The RF duplexing system of claim 24 wherein the second duplexer comprises a third tunable RF filter and a fourth tunable RF filter, wherein the third tunable RF filter is coupled to the receive port and the fourth tunable RF filter is coupled to the transmission port.

26. The RF duplexing system of claim 25 wherein the control circuit is further configured to:
tune the third tunable RF filter in the full duplexing transmission mode so that the third tunable RF filter defines a receive stopband;
tune the fourth tunable RF filter in the full duplexing transmission mode so that the fourth tunable RF filter defines a transmission stopband;
tune the fourth tunable RF filter in a half duplexing receive mode so that the fourth tunable RF filter is switched off; and
tune the third tunable RF filter in the half duplexing receive mode so that the third tunable RF filter provides the receive stopband.

27. The RF duplexing system of claim 26 wherein the RF duplexing device further comprises a tuning port and wherein:
the first tunable RF filter is configured to provide the transmission passband from the antenna port to the transmission port;
the second tunable RF filter is configured to provide the receive passband from the receive port to the antenna port;
the third tunable RF filter is configured to provide the transmission passband from the tuning port to the receive port; and
the fourth tunable RF filter is configured to provide the receive passband from the transmission port to the tuning port.

28. The RF duplexing system of claim 27 further comprising a tuner coupled to the tuning port, wherein the control circuit is configured to tune the tuner in the full duplexing transmission mode so as to provide impedance matching between the antenna port and the receive port and between the antenna port and the transmission port.

29. The RF duplexing system of claim 24 wherein:
the first duplexer includes a non-inverting transformer; and
the second duplexer includes an inverting transformer, wherein the inverting transformer is configured to provide a polarity inversion such that the second phase shift is differential to the first phase shift.

30. A method of duplexing comprising:
tuning a first tunable RF filter in a full duplexing transmission mode so that the first tunable RF filter defines a transmission passband;
tuning a second tunable RF filter in the full duplexing transmission mode so that the second tunable RF filter defines a receive passband;
tuning the first tunable RF filter in a time division duplexing mode during a transmission time period so that the first tunable RF filter defines the transmission passband;
tuning the second tunable RF filter in the time division duplexing mode during the transmission time period so that the second tunable RF filter enhances the transmission passband;
tuning the second tunable RF filter in the time division duplexing mode during a receive time period so that the second tunable RF filter defines the receive passband; and
tuning the first tunable RF filter in the time division duplexing mode during the receive time period so that the first tunable RF filter enhances the receive passband.

* * * * *

UNITED STATES PATENT AND TRADEMARK OFFICE
CERTIFICATE OF CORRECTION

PATENT NO.       : 9,853,685 B2
APPLICATION NO.  : 14/329493
DATED            : December 26, 2017
INVENTOR(S)      : Nadim Khlat and Jayanti Jaganatha Rao It is certified that error appears in the above-identified patent and that said Letters Patent is hereby corrected as shown below:

In the Specification

In Column 8, Line 57, replace "equal to $f_{TSCH}-f_{TXCL}$" with --equal to $f_{TXCH}-f_{TXCL}$--.

Signed and Sealed this
Twenty-ninth Day of May, 2018

Andrei Iancu
*Director of the United States Patent and Trademark Office*